United States Patent
Lin

(10) Patent No.: US 7,277,290 B2
(45) Date of Patent: Oct. 2, 2007

(54) SECURE DEVICE FOR A HEAT DISSIPATING COMPONENT

(75) Inventor: Tzyy-Pyng Lin, Taipei (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 2 days.

(21) Appl. No.: 11/263,932

(22) Filed: Nov. 2, 2005

(65) Prior Publication Data

US 2007/0097647 A1    May 3, 2007

(51) Int. Cl.
*H05K 7/20* (2006.01)
*H01L 23/34* (2006.01)
*F28F 7/00* (2006.01)

(52) U.S. Cl. .................. 361/709; 361/701; 361/703; 361/719; 257/718; 165/80.3

(58) Field of Classification Search ............... 361/727, 361/726, 719, 704, 697; 165/121, 80.3; 257/719
See application file for complete search history.

(56) References Cited

U.S. PATENT DOCUMENTS

| | | | | |
|---|---|---|---|---|
| 6,047,765 A | * | 4/2000 | Zhan | 165/80.3 |
| 6,600,650 B1 | * | 7/2003 | Lee | 361/697 |
| 6,896,046 B2 | * | 5/2005 | Lee et al. | 165/185 |
| 7,079,401 B2 | * | 7/2006 | Lee et al. | 361/801 |
| 7,086,456 B2 | * | 8/2006 | Lee et al. | 165/121 |
| 2004/0000398 A1 | * | 1/2004 | Lee et al. | 165/185 |
| 2004/0091311 A1 | * | 5/2004 | Lin | 403/322.4 |
| 2004/0114332 A1 | * | 6/2004 | Lee et al. | 361/719 |
| 2004/0125566 A1 | * | 7/2004 | Lee et al. | 361/707 |
| 2005/0111191 A1 | * | 5/2005 | Lee et al. | 361/704 |
| 2005/0219824 A1 | * | 10/2005 | Lee et al. | 361/709 |
| 2005/0237720 A1 | * | 10/2005 | Li et al. | 361/704 |

* cited by examiner

*Primary Examiner*—Lisa Lea-Edmonds
*Assistant Examiner*—Anthony M Haughton

(57) ABSTRACT

A secure device for a heat dissipating component provides a base body with a plurality of engaging members attached to two lateral sides thereof. Each of the engaging members further has a secure part and a follower part for clamping the heat dissipating component.

7 Claims, 8 Drawing Sheets

SECURE DEVICE FOR A HEAT DISSIPATING COMPONENT

BACKGROUND OF THE INVENTION

1. Field of the Invention:

The present invention is related to a secure device for a heat dissipating component and particularly to a secure device, which is capable of allowing a heat dissipating component being mounted easily and fast.

2. Brief Description of the Related Art:

In order to attaching a heat dissipating component such as a heat sink or a radiator to a heat generating component such as CPU (Central Processing Unit) tightly, the conventional way is that the heat dissipating component is fixed to a location on a support member such as a motherboard corresponding to the heat generating component for the heat generating component being able to reduce the temperature thereof by means of the heat dissipating component guiding heat outward rapidly.

Accordingly, ways for the heat dissipating component being joined to the heat generating component mostly are divided into the following classes.

The first class: The heat dissipating component is fixed to the support member directly with welding, adhering or screw fastening.

The second class: The heat dissipating component is mounted to a base body with secure part and the base body is fixed to the support member.

However, the way of first class has shortcomings such as inconveniently working, hard to assemble and structurally damaged. The way of second class has shortcomings such as unevenly distributed holding forces, swung heat dissipating component and displacing and broken holding parts.

Taiwanese Utility Model No. M243906 (Filing No. 9092212394 filed on Sep. 11, 2004), entitled "ENGAGING DEVICE FOR A RADIATOR", includes a radiator, fixing device and a plurality of secure parts. The radiator has a base and a plurality of cooling fins extending upward from the base. The base has inner locating holes and outer locating holes. The cooling fins has receiving spaces communicating with the locating holes. The fixing device supports the radiator with a plurality of holding arms extending upward. Each holding arm has a secure hole. Each of the secure parts includes an operation section, a secure section under the operation section and an inner and outer locating needles extending from the secure section. The inner and outer locating needles insert into the inner and outer locating hole of the radiator. The secure section hooks the secure holes of the fixing device.

However, the preceding prior art belongs to the way of second class and the structure made is inconveniently in parts assembling in addition to higher costs of material and labor.

SUMMARY OF THE INVENTION

In order to solve the preceding problems, an object of the present invention is to provide a secure device for holding the heat dissipating component conveniently.

Another object of the present invention is to provide a secure device for obtaining evenly distributed holding forces exerting to the heat dissipating component such that the heat dissipating component is capable of being flatly joined to a heat generating component tightly.

A further object of the present invention is to provide a secure device for a base body being subjected to uniform forces instead of concentration force such that broken base body is avoidable.

A further object of the present invention is to provide a secure device with which costs with regard to material and assembling work are reduced substantially.

A further object of the present invention is to provide a secure device with which engaging members for holding the heat dissipating component are flexibly added or decreased based on needs.

In order to achieve the preceding objects, the secure device for a heat dissipating component according to the present invention includes a base body and a plurality of engaging members, which provide at least a secure part and a follower part respectively and pivotally connect with the base body.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
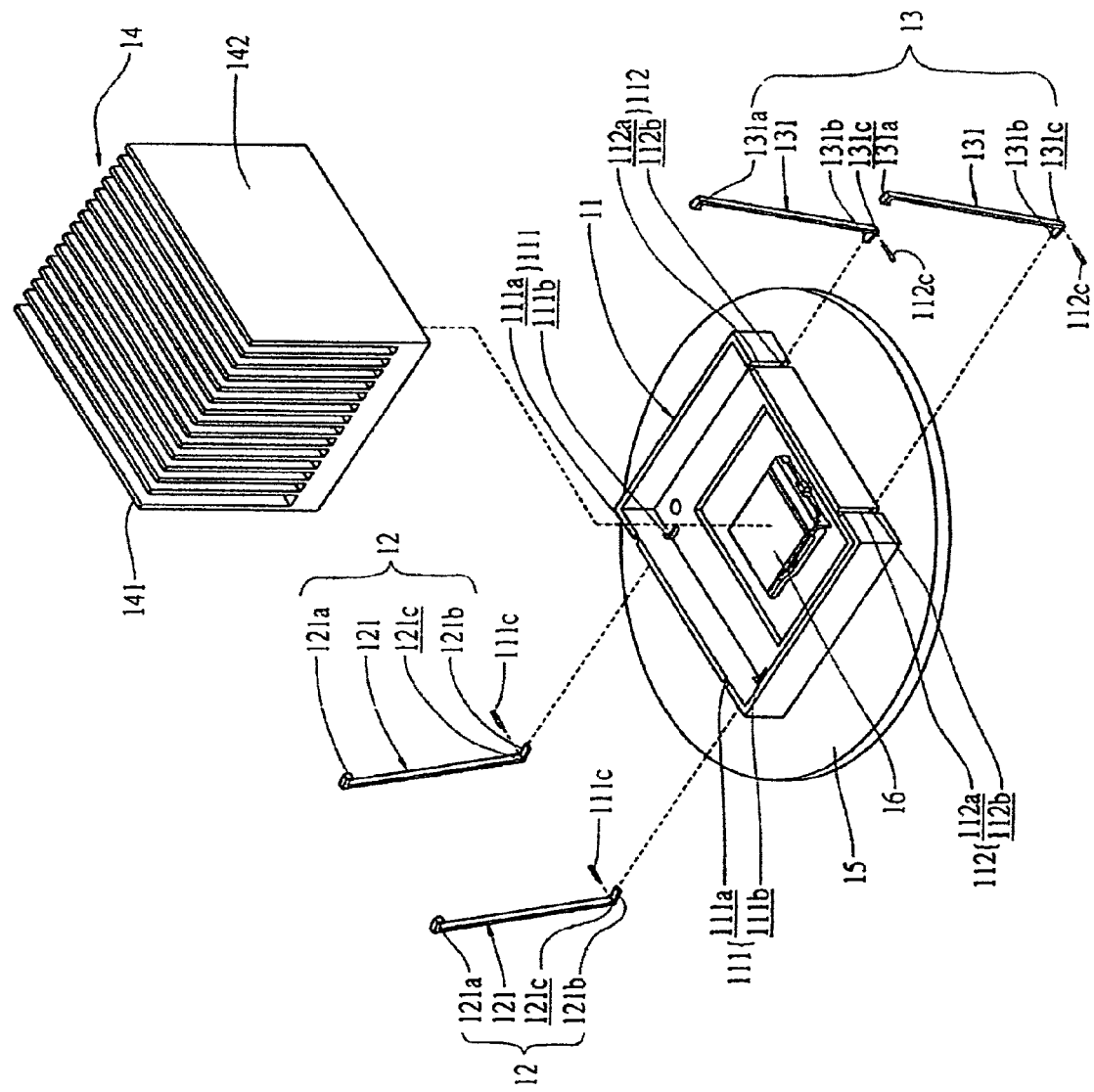
FIG. 1 is an exploded perspective view of the first embodiment of a secure device for a heat dissipation assembly according to the present invention.

Referring to FIG. 1, the first preferred embodiment of a secure device for a heat dissipation assembly according to the present invention provides a base 11 with a first locating set 12 at a lateral side thereof and a second locating set 13 at another lateral side thereof. The first locating set 12 further includes a plurality of engaging members 121 and each of the engaging members 121 includes a secure part 121a and a follower part 121b. The second locating set 13 further includes a plurality of engaging members 131 and each of the engaging members 131 includes a secure part 131a and a follower part 131b.

Figure 2:
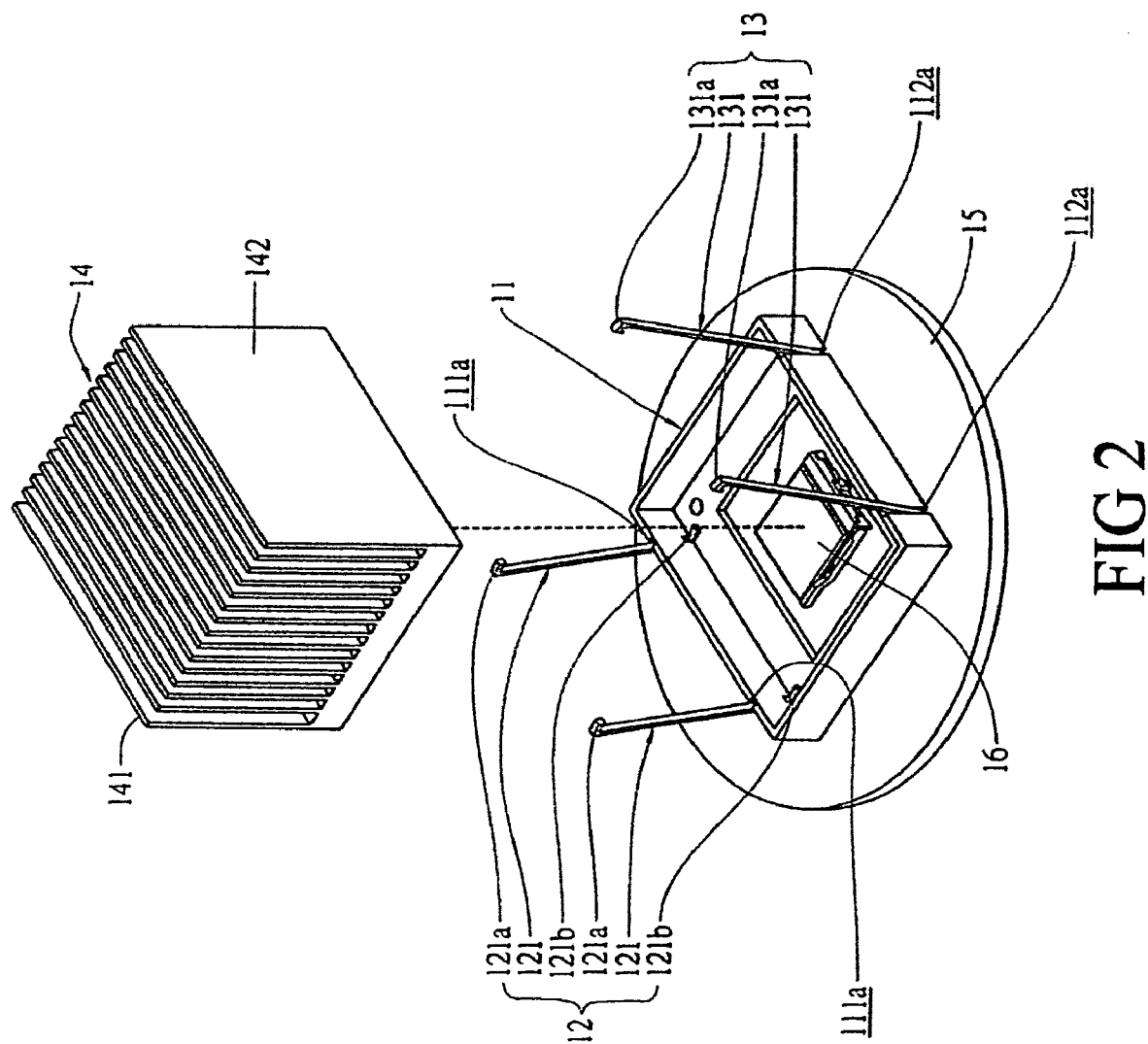
FIG. 2 is a partly assembled perspective view of the first embodiment of a secure device for a heat dissipation assembly according to the present invention.

Referring to FIG. 2 with reference to FIG. 1 again, the base 11 has a plurality of first receiving parts 111 and a plurality of second receiving parts 112 at the lateral sides thereof corresponding to the first locating set 12 and the second locating set 13 respectively. Each of the first receiving parts 111 provides a first groove 111a and a first locating hole 111b and each of the second receiving parts 112 provides a second groove 112a and a second locating hole 112b respectively. The first groove 111a and the second groove 112a are received with one of the engaging members 121 of the first locating set 12 and one of engaging members 131 of the second locating set 13 respectively. The first locating hole 111b is available for a connecting unit 111c passing through a mounting hole 121c at each of the engaging member 121 and pivotally joining a lateral side of the base body 11. The second locating hole 112b is available for a connecting unit 112c passing through a mounting hole 131c at each of the engaging member 131 and pivotally joining another lateral side of the base body 11.

Figure 3:
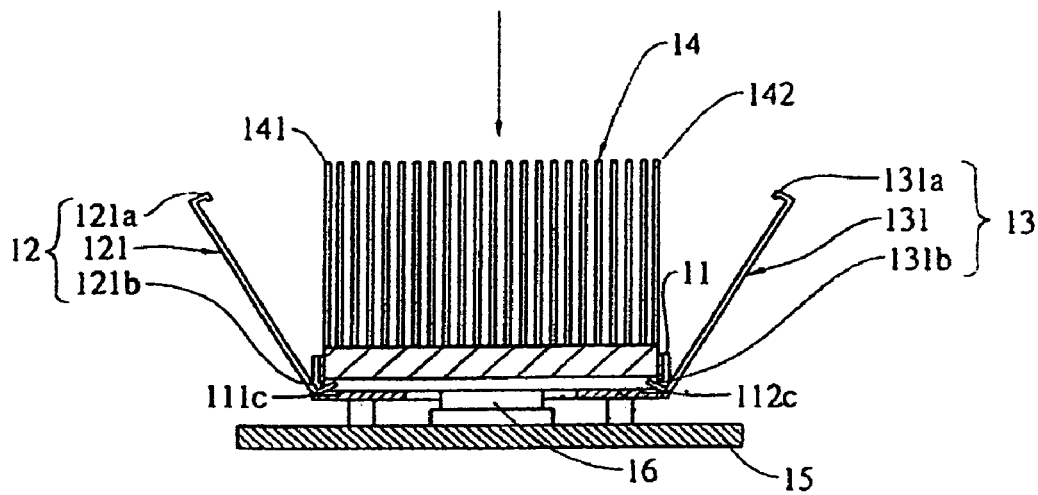
FIG. 3 is a sectional view illustrating the heat dissipating component in the first embodiment of a secure device for a heat dissipation assembly according to the present invention before being clamped by the first locating set and the second locating set.
Figure 4:
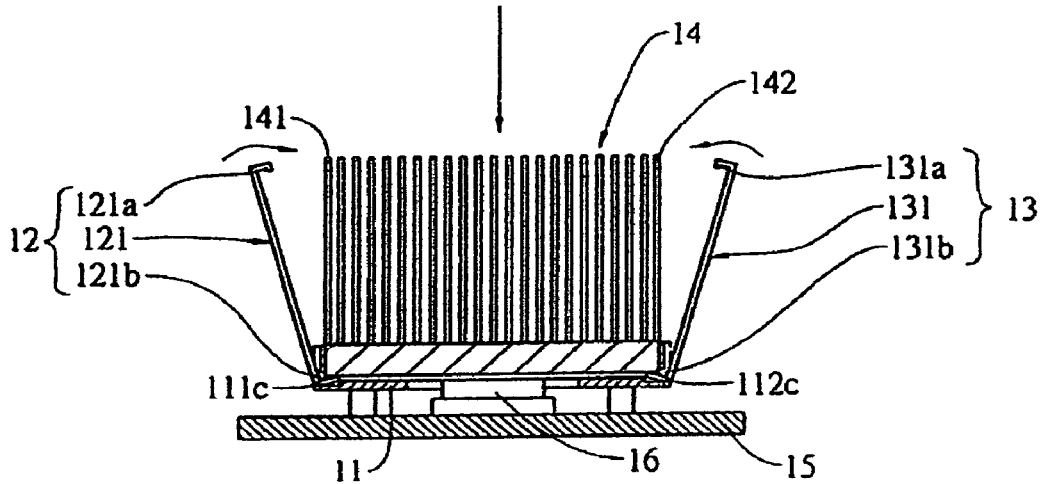
FIG. 4 is a sectional view illustrating the heat dissipating component in the first embodiment of a secure device for a heat dissipation assembly according to the present invention being in the process of being clamped by the first locating set and the second locating set.
Figure 5:
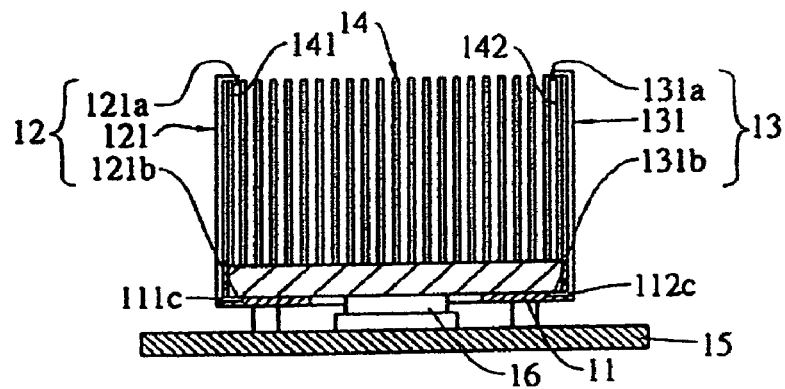
FIG. 5 is a sectional view illustrating the heat dissipating component in the first embodiment of a secure device for a heat dissipation assembly according to the present invention being clamped by the first locating set and the second locating set.
Figure 6:
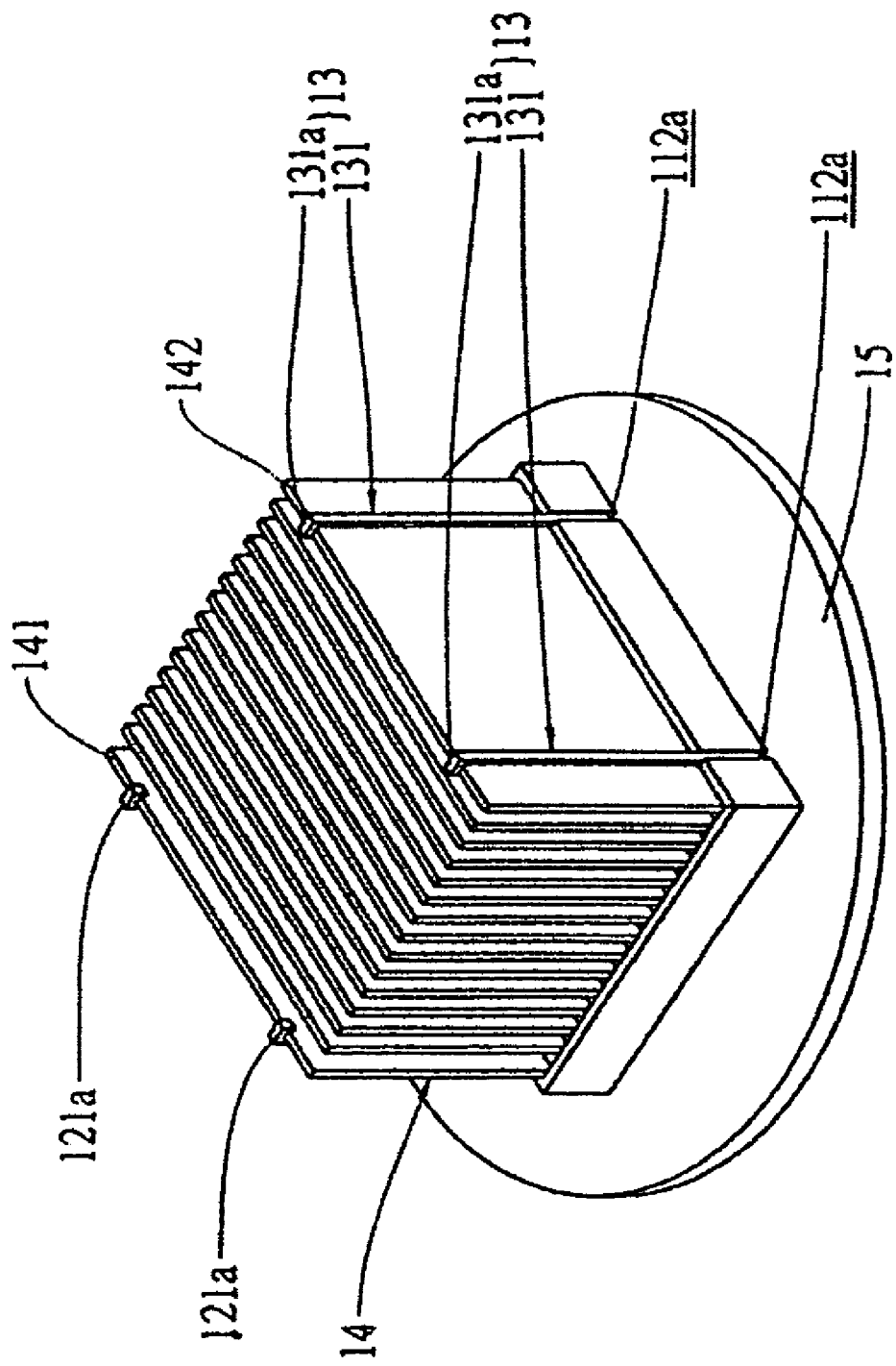
FIG. 6 is an assembled perspective view of the first embodiment of a secure device for a heat dissipation assembly according to the present invention.

Referring to FIGS. 3, 4, 5 and 6 with reference to FIGS. 1 and 2 again, when the secure device of the present invention is in use, the heat dissipating component 14 is placed inside the base body 11 as shown in FIG. 3 to press the follower part 121b of each engaging member 121 and the follower part 131b of each engaging member 131 as shown in FIG. 4. The follower parts 121b, 131b are actuated downward gradually along with the heat dissipating component 14 moving downward continuously such that the secure part 121a of each engaging member 121 and the secure part 131a of each engaging member 131 are actuated to move inward gradually till catching upper edges 141, 142 of the cooling fins as shown in FIGS. 5 and 6. In this way, the heat dissipating component 14 is capable of being tightly attached to a CPU 16 on a support member 15.

Figure 7:
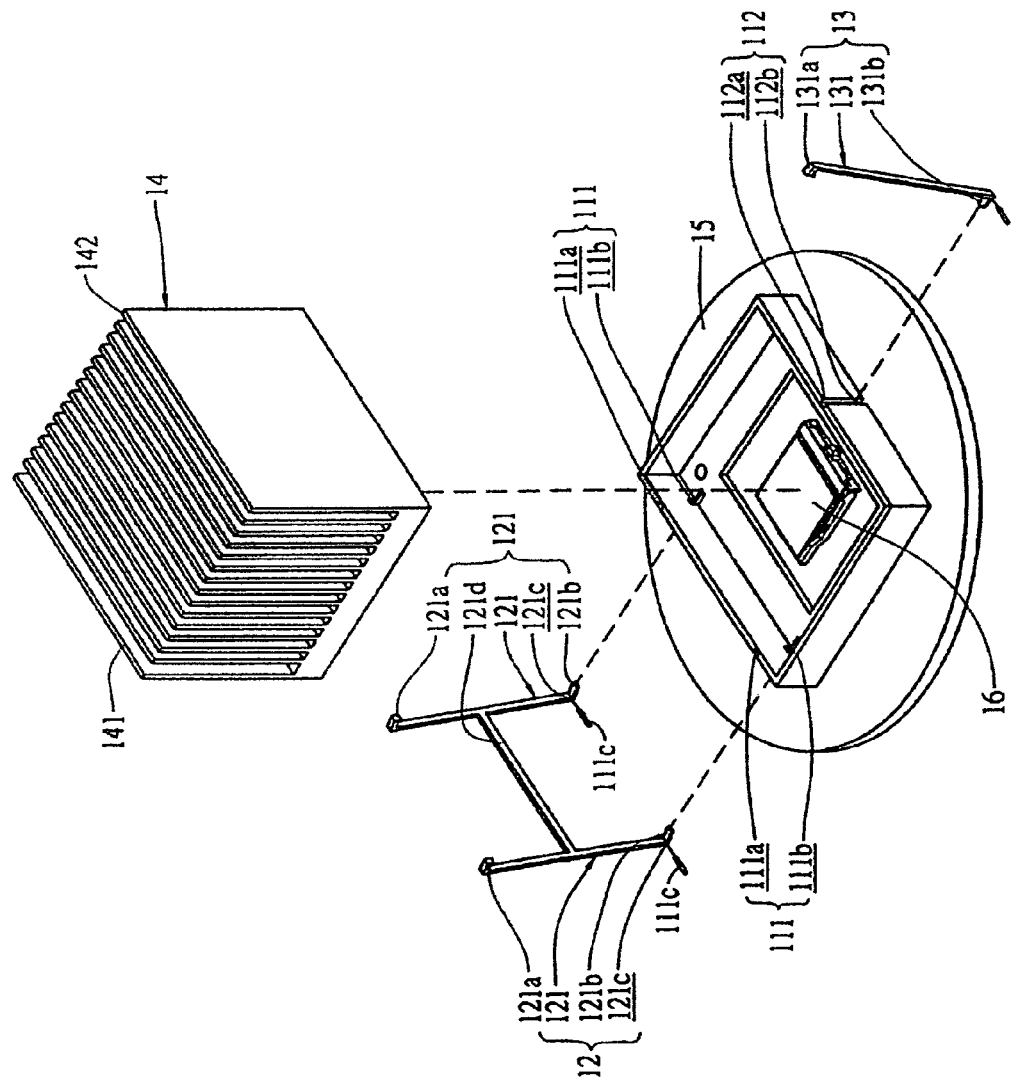
FIG. 7 is an exploded perspective view of the second embodiment of a secure device for a heat dissipation assembly according to the present invention.

Referring to FIG. 7, the second embodiment of a secure device for a heat dissipation assembly according to the present invention is illustrated. The difference of the present embodiment is in that a connecting unit 121d is disposed between the engaging members 121 of the first locating set 12 and the second locating set 13 provides one engaging member 131 only.

Figure 8:
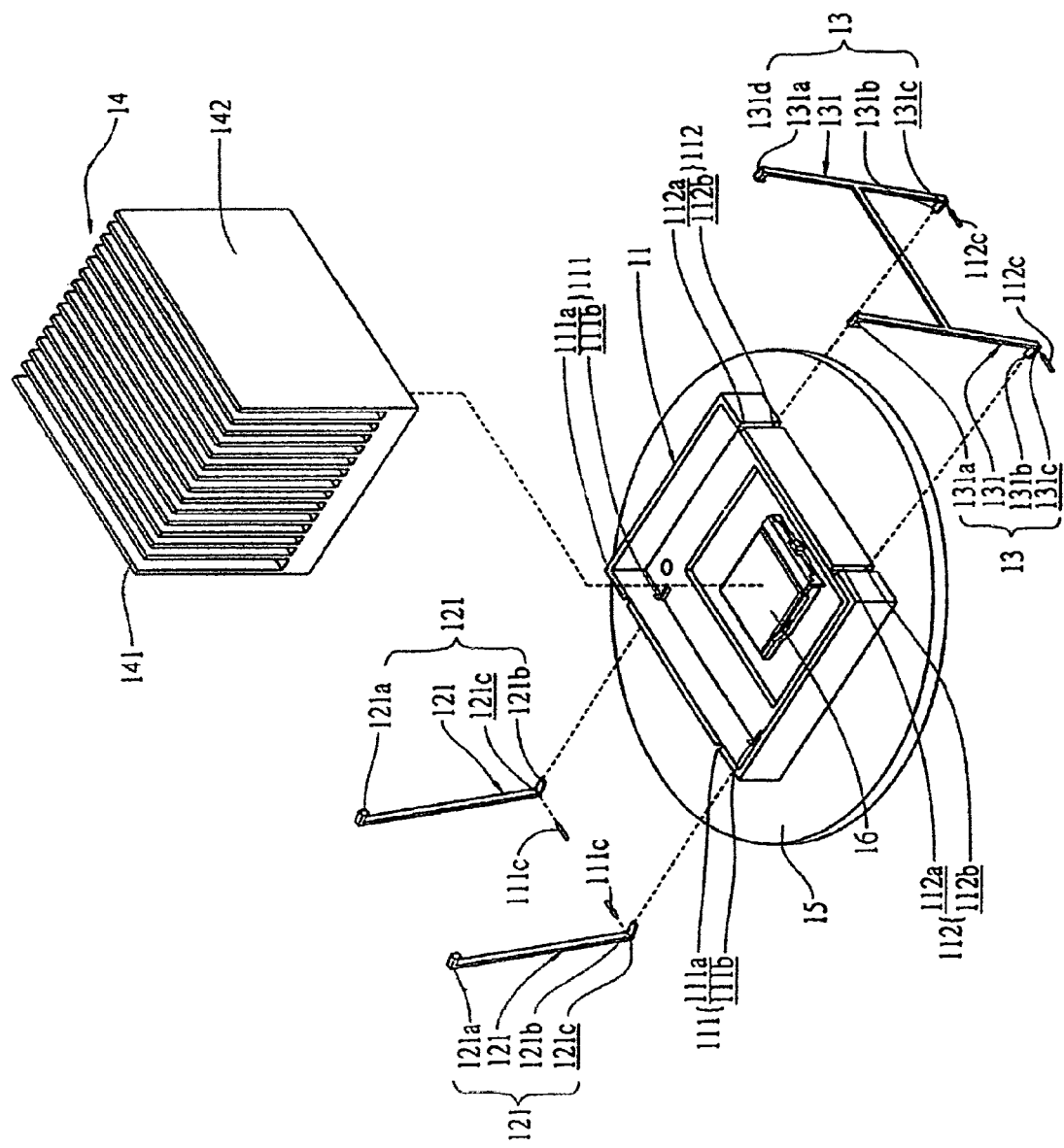
FIG. 8 is an exploded perspective view of the third embodiment of a secure device for a heat dissipation assembly according to the present invention.
Figure 9:
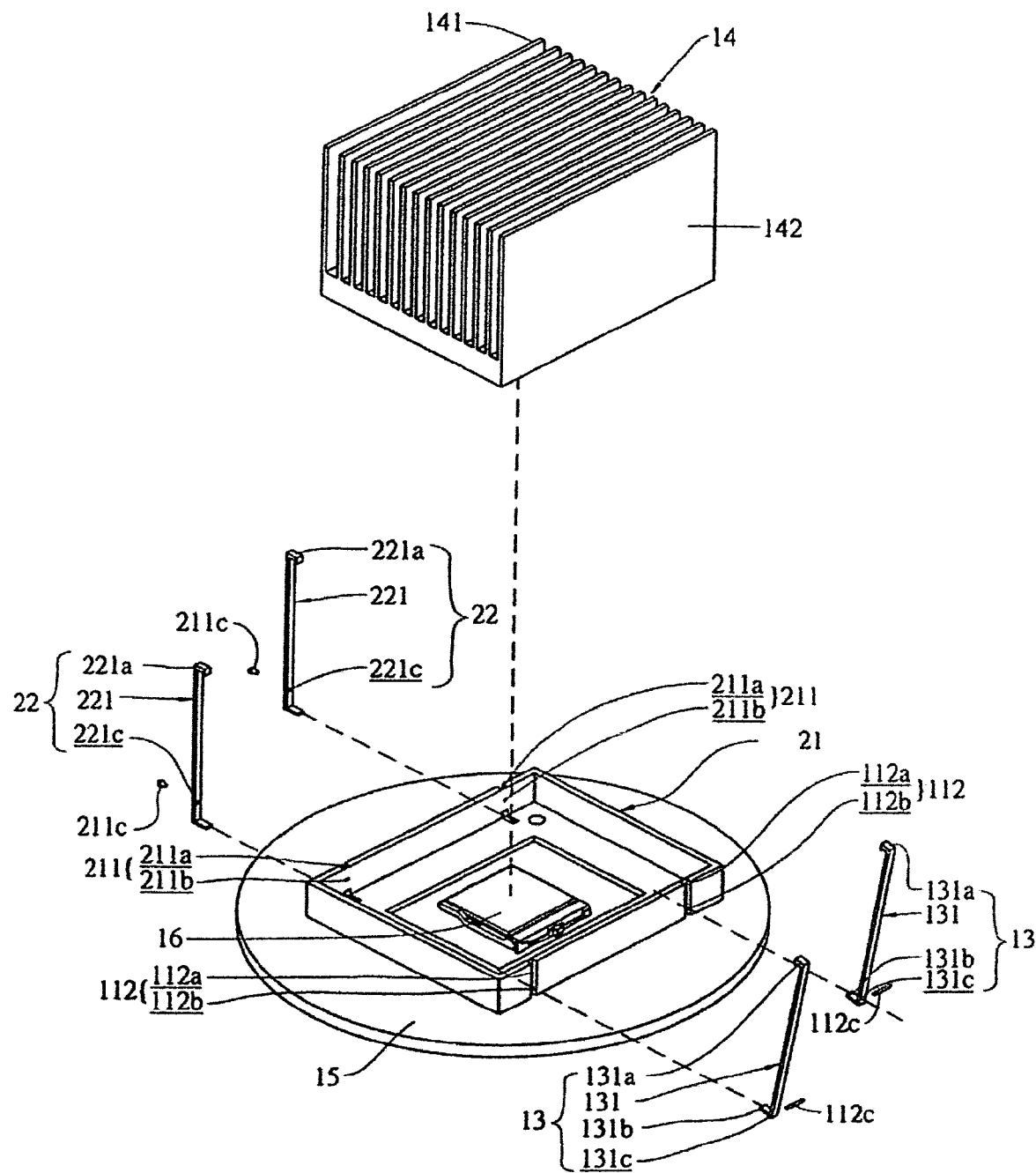
FIG. 9 is an exploded perspective view of the fourth embodiment of a secure device for a heat dissipation assembly according to the present invention.

Referring to FIG. 8, the third embodiment of a secure device for a heat dissipation assembly according to present invention is illustrated. The difference of the present embodiment is in that a connecting unit 131d is disposed between the engaging members 131 of the second locating set 13.

Referring to FIGS. 9, 10, 11 and 12, the fourth embodiment of a secure device for a heat dissipation assembly according to present invention is illustrated. The difference of the present embodiment is in that the engaging members 221 of the first locating set 22 are fixedly joined to a lateral side of the base body 21 and the engaging members 131 of the second locating set 13 are pivotally attached to another side of the base body 21. It can be seen in FIG. 9 that each of the engaging members 221 of the first locating set 22 has a through hole 221c at the lower section thereof and the lateral side of the base body 21 has a fixing hole 211b at the first groove 211a corresponding to the fixing hole 211b such that the respective engaging member 221 is capable of fixedly joined to the first groove 211a with a fastener 211c.

Figure 10:
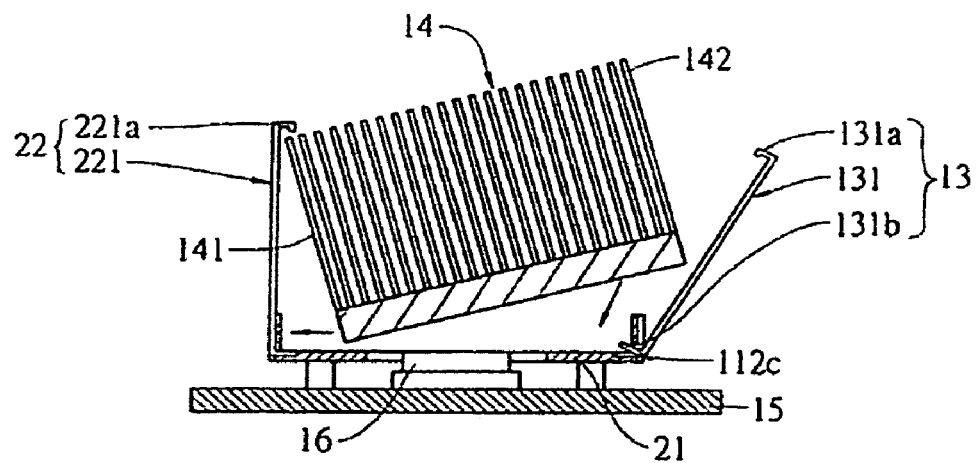
FIG. 10 is a sectional view illustrating the heat dissipating component in the fourth embodiment of a secure device for a heat dissipation assembly according to the present invention before being clamped by the first locating set and the second locating set.
Figure 11:
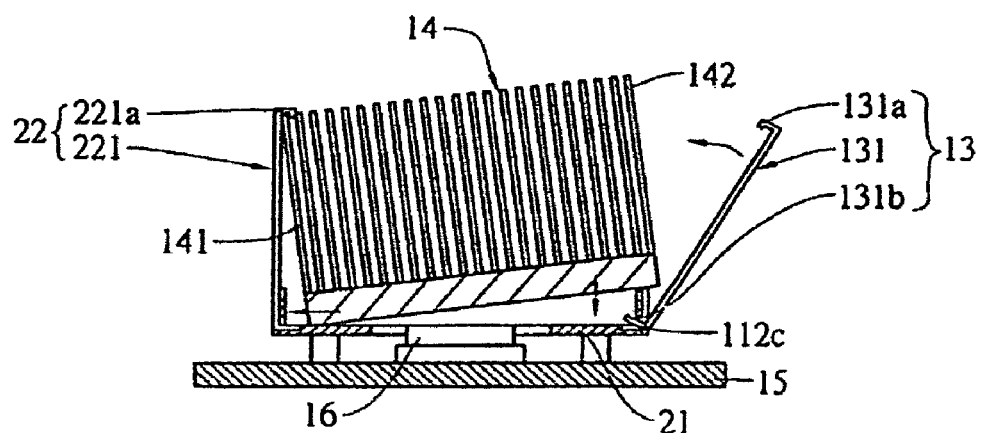
FIG. 11 is a sectional view illustrating the heat dissipating component in the fourth embodiment of a secure device for a heat dissipation assembly according to the present invention being in the process of being clamped by the first locating set and the second locating set.
Figure 12:
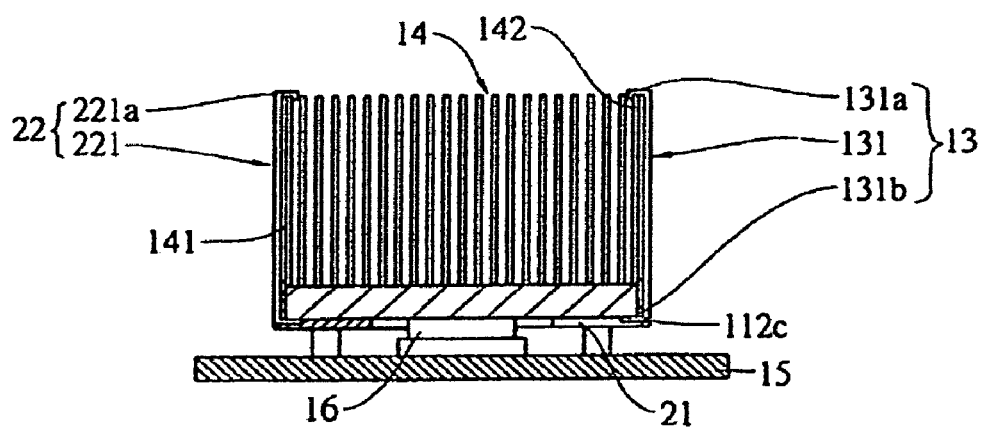
FIG. 12 is a sectional view illustrating the heat dissipating component in the fourth embodiment of a secure device for a heat dissipation assembly according to the present invention being clamped by the first locating set and the second locating set.

While the secure device of the preceding fourth embodiment is in use, a lateral side of the heat dissipating component 14 is placed in the base body 21 as shown in FIG. 10 to press the secure parts 221a of the engaging members 221 such that the secure parts 221a are capable of catching the upper edge of the heat dissipating component 14 as shown in FIG. 11. Then, another lateral side of the heat dissipating component 14 is placed inside the base body 21 to press the follower part 131b of each engaging member 131 as shown in FIG. 12. The follower parts 131b are actuated downward gradually along with the heat dissipating component 14 moving downward continuously such that the secure part 131a of each engaging member 131 are actuated to move inward gradually till catching upper edges 142 of the cooling fins as shown in FIGS. 12. In this way, the heat dissipating component 14 can be tightly attached to the CPU 16 on the support member 15.

As the foregoing, the first locating set 22 and the second locating set 13 are mounted to the lateral sides of the base body by means of fixed joining and the engaging members are provided elastically for being able to expand and secure the heat dissipating component to the base body.

It is appreciated that comparing to the prior art, the secure device of the present invention has the following advantages:

The secure device of the present invention applies lever principle, that is, the respective pivot unit acts as the fulcrum and the follower part and the secure part of each engaging member are disposed at both ends of the pivotal unit. The secure parts approach the heat dissipating component gradually till the heat dissipating component has touched the base body completely when the heat dissipating component moves toward the base body gradually. Once the heat dissipating component has touched the base body completely, the engaging members are capable of clamping the heat dissipating component tightly. It only needs one movement for performing the job of the heat dissipating component being mounted to the base body.

The secure device of the present invention applies multiple forces exerting to the base body such that the base body is subjected to forces evenly such that the secure device is hard to become fracture and the effect of clamping can be maintained even if one or two spots in the secure device are fractured.

Due to multiple-force clamping being used, the clamping forces are evenly distributed such that the heat dissipating component is capable of tightly attached to the heat generation component such as CPU flatly via the base body for heat being able to transmit outward rapidly.

The secure device of the present invention is fabricated with less material and labor costs and is much simpler for being set up with much better effect in use than the prior art.

Number of the engaging members in the secure device of the present invention can be added or reduced flexibly to comply with heat dissipating component in different shapes such as circular or rectangular shapes.

The first locating sets and the second locating sets in the secure device of the present invention can be provided to meet different necessities such as all of them being pivotal, only one of them being pivotal or all of them being fixed.

While the invention has been described with referencing to preferred embodiments thereof, it is to be understood that modifications or variations may be easily made without departing from the spirit of this invention, which is defined by the appended claims.

What is claimed is:

1. A secure device mounted to a heat dissipating component, which provides a plurality of parallel cooling fins, comprising:

a frame shaped base body being provided for accommodating the heat dissipating component, having four corners, providing two grooves at each of two opposite lateral sides thereof being disposed near and parallel to the four corners respectively and a locating hole being disposed at the bottom of the respective groove and passing through the respective lateral side; and four rod shaped engaging members being provided to fit with the grooves respectively, each of the engaging members providing a bent upper end and a bent lower end, the bent upper end constituting a secure part to hold the upper edge of the heat dissipating component, the bent lower end passing through the respective lateral side via the locating hole as a follower part for the respective engaging member being capable of pivoting with respect to the follower part;

whereby, once the heat dissipating component is placed in the base body to touch a central processing unit (CPU) at the center of the base body, the respective engaging member is capable of holding the heat dissipating component in a way of said engaging members fitting with said grooves, said follower part being pressed with the heat dissipating component and the secure part holding the top of the heat dissipating component elastically and tightly; and once the heat dissipating component is detached from the base body, the follower part is free from being pressed by the heat dissipating component and the engaging member is capable of being pivotally moved away instead of holding the heat dissipating component.

2. The secure device mounted to a heat dissipating component as defined in claim 1, wherein a mounting hole is disposed between the respective engaging member and die follower part such that the respective engaging member is capable of being pivotally joined to the respective lateral side with a pivotal unit.

3. The secure device mounted to a heat dissipating component as defined in claim 1, wherein the two engaging members at one of said two opposite lateral sides being joined to each other with a rod shaped connecting unit.

4. A secure device mounted to a heat dissipating component, which provides a plurality of parallel cooling fins, comprising:

a frame shaped base body being provided for accommodating the heat dissipating component, having four corners, providing two grooves at each of two opposite lateral sides thereof being disposed near and parallel to the four corners respectively and a locating hole being disposed at the bottom of the respective groove and passing through the respective lateral side;

two rod shaped first engaging members being provided to fixedly attached to the two grooves at a first lateral side, each of the first engaging members providing a bent upper end and a bent lower end, the bent upper end constituting a secure part to hold the upper edge of the heat dissipating component, the bent lower end passing through the respective lateral side via the locating hole; and two rod shaped second engaging members being provided to fit with the grooves at a second lateral side, which is opposite to the first lateral side, each of the second engaging members providing a bent upper end and a bent lower end, the bent upper end constituting a secure part to hold the upper edge of the heat dissipating component, the bent lower end passing through the respective lateral side via the locating hole as a follower part for the respective engaging member being capable of pivoting with respect to the follower part;

whereby, once the heat dissipating component is placed in the base body to touch a central processing unit (CPU) at the center of the base body, the respective engaging member is capable of holding the heat dissipating component in a way of said first engaging members fixedly joined to the first grooves, the second engaging members fitting with said second grooves, said follower part being pressed with the heat dissipating component and the secure part holding the upper edge of the heat dissipating component elastically and tightly; and once the heat dissipating component is detached from the base body, the follower part is free from being pressed by the heat dissipating component and the second engaging members are capable of being pivotally moved away from the heat dissipating component instead of holding the heat dissipating component.

5. The secure device mounted to a heat dissipating component as defined in claim 4, wherein the respective first engaging member has a through hole at the lower section thereof and the first grooves provides a fixing hole corresponding to the through hole for the first engaging members being joined to the first lateral side with a fastener respectively.

6. A secure device mounted to a heat dissipating component, which provides a plurality of parallel cooling fins, comprising:

a frame shaped base body being provided for accommodating the heat dissipating component, providing two first grooves at a first lateral side thereof and a second groove at a second lateral side, which is opposite the first lateral side, in a way of the first grooves being disposed near and parallel to two corners next to the first lateral side respectively and the second groove being disposed at the middle of the second lateral side, a first locating hole being disposed at the bottom of the respective groove and passing through the respective lateral side; and two rod shaped first engaging members being provided to fit with the first grooves respectively, each of the first engaging members providing a bent upper end and a bent lower end, the bent upper end constituting a first secure part to hold the upper edge of the heat dissipating component, the lower end passing through the respective lateral side via the first locating hole to constitute a first follower part for the respective engaging member being capable of pivotally moving with respect to the first follower part and the first engaging members being joined to each other with a rod shaped connecting unit;

a rod shaped second engaging member being provided to fit with the second groove, the second engaging member providing another bent upper end and another bent lower end, said bent upper end constituting a second secure part to hold the upper edge of the heat dissipating component, said lower end passing through the respective lateral side via the second locating hole to constitute a second follower part for the second engaging member being capable of pivoting with respect to the second follower part;

whereby, once the heat dissipating component is placed in the base body to touch a central processing unit (CPU) at the center of the base body, the respective engaging member is capable of holding the heat dissipating component in a way of said engaging members fitting with said grooves, said follower parts being pressed with the heat dissipating component and said secure parts holding the upper edge of the heat dissipating component elastically and tightly; and once the heat dissipating component is detached from the base body, said follower parts are free from being pressed by the heat dissipating component and said engaging members are capable of being pivotally moved away the heat dissipating component instead of holding the heat dissipating component.

7. The secure device mounted to a heat dissipating component as defined in claim 6, wherein a mounting hole is provided between the respective engaging member and the follower part such that the respective engaging member is capable of being pivotally joined to the respective lateral side with a pivotal unit.

* * * * *